United States Patent [19]

Chapman et al.

[11] Patent Number: 4,849,313

[45] Date of Patent: Jul. 18, 1989

[54] METHOD FOR MAKING A RETICLE MASK

[75] Inventors: David C. Chapman, Campbell; Wesley R. Erck, Hayward, both of Calif.

[73] Assignee: VLSI Technology, Inc., San Jose, Calif.

[21] Appl. No.: 187,499

[22] Filed: Apr. 28, 1988

[51] Int. Cl.⁴ .......................... G03F 1/00; G03F 9/00
[52] U.S. Cl. .................................. 430/5; 430/22; 430/394; 355/53; 355/54
[58] Field of Search ............... 430/5, 394, 22; 355/53, 355/54, 77

[56] References Cited

U.S. PATENT DOCUMENTS

| 4,505,580 | 3/1985 | Michel | 355/53 |
| 4,610,940 | 9/1986 | Araihara | 430/5 |
| 4,708,466 | 11/1987 | Isehata et al. | 355/53 |

Primary Examiner—José G. Dees
Attorney, Agent, or Firm—Limbach, Limbach & Sutton

[57] ABSTRACT

An apparatus and a method for making a reticle mask is disclosed. A reticle mask is made by the double pass method wherein scribe lines are first drawn on the reticle mask. Thereafter, a product die pattern is made in the reticle mask by a plurality of times. A plurality of alignment marks are associated with each product die pattern. The plurality of alignment marks are all written in the scribe line region. Thus, any deviation of the relative position of the product die pattern to the scribe line may be quantified.

16 Claims, 2 Drawing Sheets

FIG. 6 a reticle mask of the type that is used by wafer steppers in the manufacture of integrated circuit devices. More particularly, the present invention relates to a double pass method for making a reticle mask wherein alignment indicia for the product die patterns are recorded in the scribe line portions of the mask.

METHOD FOR MAKING A RETICLE MASK

TECHNICAL FIELD

The present invention relates to a method for making a reticle mask of the type that is used by wafer steppers in the manufacture of integrated circuit devices. More particularly, the present invention relates to a double pass method for making a reticle mask wherein alignment indicia for the product die patterns are recorded in the scribe line portions of the mask.

BACKGROUND OF THE INVENTION

Heretofore, integrated circuit devices have been made from semiconductor wafers. A plurality of such devices (typically on the order of hundreds or thousands) are made on a single circularly shaped wafer, (e.g. having a diameter of five inches). Each integrated circuit device is made in a rectangularly shaped region with scribe lines surrounding each rectangularly shaped region. Each rectangularly shaped region is called a product die. The scribe lines that surround each product die are used by a cutting tool to cut and separate the product dies from one another after they have been manufactured on the semiconductor wafer. See FIG. 1 for a plan view of a typical layout of product dies and scribe lines on a semiconductor wafer.

Figure 2:
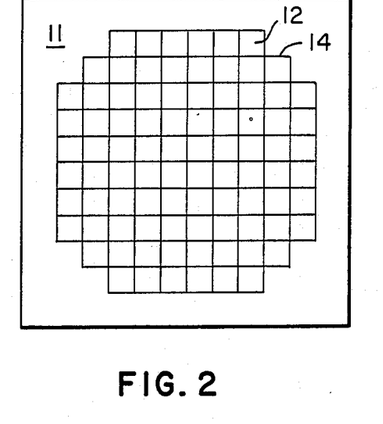
FIG. 2 is a schematic plan view of a full-field mask.

Masks have been used to transfer optical images onto the semiconductor wafer in the process of manufacturing the integrated circuit devices. A mask is typically made from a clear glass plate with patterned opaque regions and patterned transparent regions through which light is passed and through which the patterned opaque or transparent regions are then exposed onto the semiconductor wafer. A mask can be one of two types. A full-field mask is a mask which is used to expose an entire wafer in a single exposure. Necessarily, a full field mask has the optical pattern of a product die repeated throughout the full field mask. Further, there are at least as many product die patterns on the full field mask as product dies that are ultimately manufactured on the semiconductor wafer. A typical full field mask is shown in FIG. 2.

Another type of a mask is called a reticle mask. A reticle mask contains a few product die patterns. For example, a reticle mask contains four product die patterns that are positioned in a two-by-two array with scribe lines surrounding each of the product die patterns. The reticle mask is used in a wafer stepper machine which exposes a part of the semiconductor wafer at a time. The wafer stepper then steps to another portion of the semiconductor wafer and repeats the process until the entire semiconductor wafer has then been exposed. An example of a reticle mask is shown in FIG. 3.

In the process of making reticle masks, alignment or registration marks are placed on the mask. After the reticle mask is made, the registration or alignment marks are used to check the accuracy of the mask, i.e., the position of each product die relative to the position of the scribe lines and the position of the scribe lines in one mask relative to the scribe lines in another mask.

Figure 3:
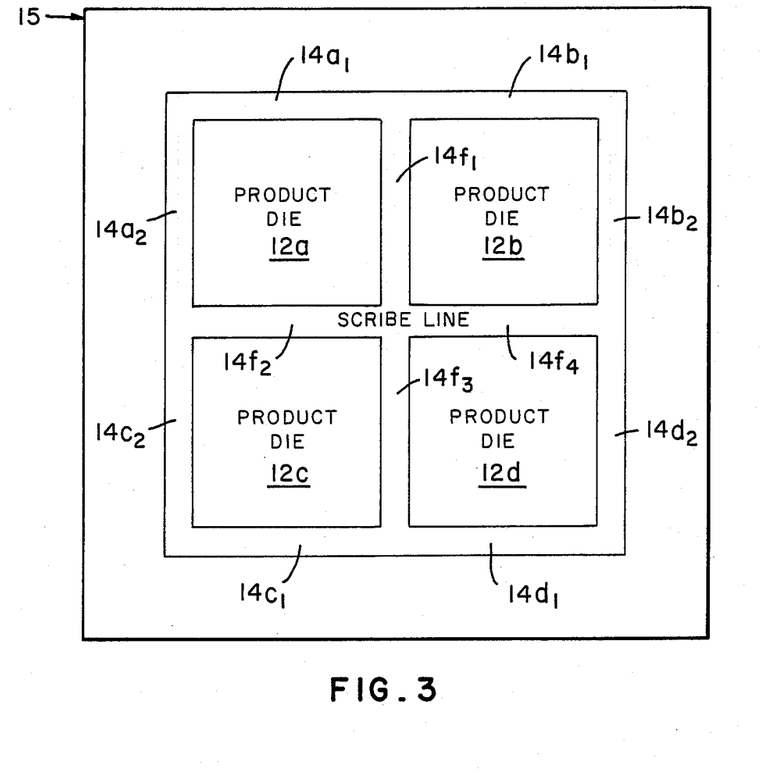
FIG. 3 is a schematic plan view of an example of a reticle mask having four product dies, arranged in a 2×2 array, with scribe lines separating the product dies.

If the reticle mask contains a plurality of product die patterns (for example, four product die patterns as shown in the example in FIG. 3, arranged in a 2×2 array), a double pass process is used to make the reticle mask. First, the scribe lines for the reticle mask are written and created on the reticle mask. Thereafter, a single product die pattern is written a plurality of times (four in the example shown in FIG. 3) and placed in relative position to the scribe lines. In the double pass process, the alignment marks become critical as they determine the relative position accuracy of the product die patterns to the scribe lines.

Heretofore, a number of methods have been suggested for placing the alignment marks or registration marks in order to check the accuracy of the position of the product die patterns relative to the scribe line.

First, alignment marks have been placed inside the product die pattern region. Typically, these registration marks are placed in the corner of the product die pattern. However, because of reliability problems, the registration marks cannot be placed directly on top of each other. Further, the registration marks on the final passivation layer mask may have to be omitted entirely. In addition, the marks consume area which could be dedicated to the designer of circuits. Finally, the position of the marks restrict the location where the designer can place the circuits.

A second technique that has been proposed heretofore is to place the registration marks in the scribe line area during the first pass to make the scribe lines. Since the scribe line region is not part of the circuit layout, it does not contain circuitry related to the product die. It is removed when the semiconductor wafer is separated into individual dies. However, if the scribe lines are placed on the mask separately from the product die patterns as in a double pass process, marks placed within the scribe line area do not reflect the relative position accuracy of the scribe line to the product die pattern. Since this fails to measure the placement of the most important data, i.e., the relative position of the product die pattern to the scribe line, this method is not acceptable.

A final prior art technique is the creation of a mask using the product die pattern and the scribe line pattern in a single pass. This technique is practical only when there is only a single product die pattern in a reticle mask. Since the method of the present invention relates to a double pass method, this prior art technique is not relevant.

SUMMARY OF THE INVENTION

In the present invention, where a double pass method of making a reticle mask is disclosed, the mask has a plurality of spaced apart product regions, with each product region for use in the fabrication of integrated circuit devices. A plurality of border regions surround each product region. A plurality of alignment marks are placed in the border regions. The method comprises the steps of exposing an unexposed mask to form a plurality of spaced apart product regions of one type of exposure. Exposing the unexposed mask also forms a plurality of first regions where the first regions are congruent with and correspond to the border regions. Each of the first regions has areas of another type of exposure, and a plurality of indicias of the one type of exposure, with each of the indicias positioned in a defined relationship with each of the product regions. The mask is then exposed to a product frame. The product frame has a product region, a plurality of first alignment marks outside of the product region positioned in the same defined relationship with the product region as the indicias have in relationship with each of the product regions of the mask. A ring of the one type of exposure surrounds the product region and covers the rest of the product frame. The product region of the product frame is positioned over one of the product regions of the mask and the first alignment marks are positioned over the plurality of indicias. The mask is then exposed to the product frame. This step is repeated by positioning another product frame over another product region until all of the product regions and indicias of the mask have been exposed.

DETAILED DESCRIPTION OF THE DRAWINGS

Figure 1:
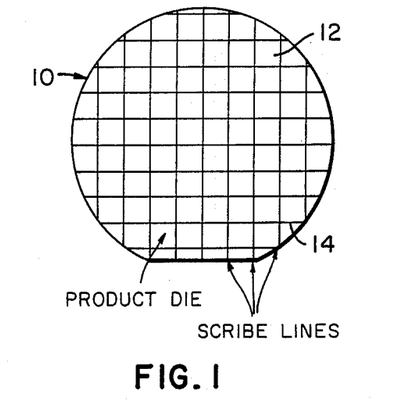
FIG. 1 is a plan schematic view of a semiconductor wafer with a plurality of rectilinearly shaped product dies with scribes lines separating each product die from one another.

Referring to FIG. 1, there is shown a plan view of a semiconductor wafer 10 with a plurality of product dies 12 and a plurality of scribe lines 14 thereon. Each of the product dies 12 is rectilinearly shaped and is preferably of a rectangular shape. The scribe lines 14 form a rectangularly shaped grid and border each of the product dies 12.

Referring to FIG. 2, there is shown a plan view of a full-field mask 11 with a plurality of product dies 12 with each product die separated by a scribe line 14 from one another. There are at least as many product dies 12 as there are product dies to be manufactured on the semiconductor wafer 10 and thus, the mask 11 is a full-field mask.

Referring to FIG. 3, there is shown an example of a reticle mask 15. The reticle mask 15 comprises four product dies 12 ($a$–$d$) arranged in a two-by-two array with a plurality of scribe lines $14a_1$, $14a_2$, ..., $14d_2$, $14f_1$, ..., $14f_4$. There are four scribe lines associated with each product die and thus, the scribe lines surround each product die.

Figure 4:
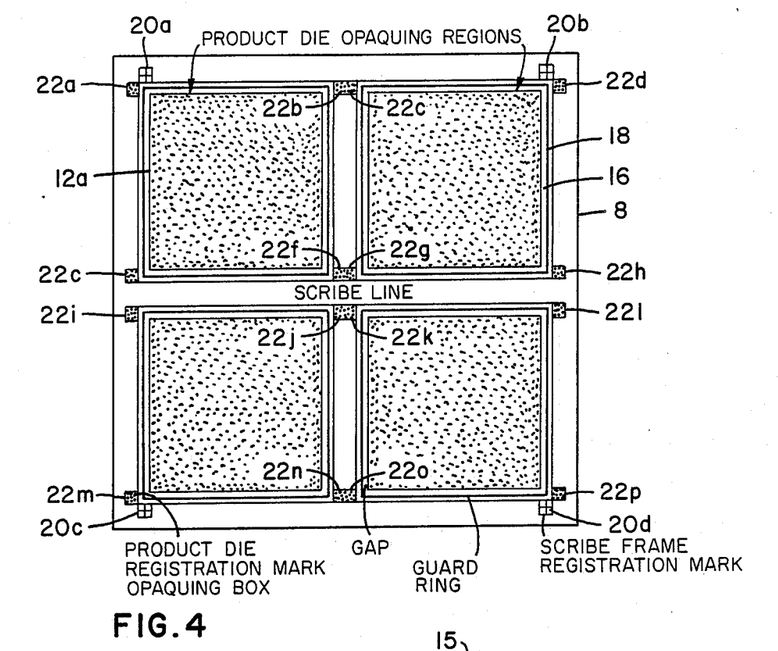
FIG. 4 is a plan view of an example of a scribe frame used in the method of the present invention.

In the method of the present invention to make the reticle mask 15 of the present invention, a scribe frame 8 is used. The scribe frame 8 is shown in FIG. 4. The scribe frame 8 has a plurality of spaced apart congruent opaque regions 12 ($a$–$d$). Each of the opaque regions 12 ($a$–$d$) are congruent to one another, i.e., they have the same shape and size. Further, each of the opaque regions 12 ($a$–$d$) are congruent with and correspond to one of the product die regions 12 ($a$–$d$) of the reticle mask 15 shown in FIG. 3.

Surrounding each of the opaque regions 12($a$–$d$) are a plurality of first regions. The first regions are congruent with and correspond to the scribe line regions 14 of the reticle mask 15 shown in FIG. 3. The first regions have exposed area, a plurality of first alignment marks 20 ($a$–$d$) and a plurality of unexposed indicias 22 ($a$–$p$).

Each of the first alignment marks 20 ($a$–$d$) is substantially rectilinearly shaped and is preferably square shaped. The first alignment marks are positioned in a defined relationship with the scribe line regions and are preferably symmetrical about the scribe line regions 14. Thus, in the example shown in FIG. 4, the alignment marks 20 ($a$–$d$) are located in the upper scribe line ($14a_1$–$14b_2$) in the left and right extremes, respectively, and also in the lower scribe line ($14c_1$–$14d_1$) in the left and right extreme positions, respectively. It should be noted that the description of upper, lower, left and right are only reference positions with regard to that which is shown in FIG. 4.

Each of the unexposed indicias 22 is substantially rectangularly shaped and is positioned in a defined relationship with each of the opaque regions 12 ($a$–$d$). Preferably, the unexposed indicias 22 are positioned symmetrically about each of the opaque regions 12 ($a$–$d$) and each is square in shape. There are four unexposed indicias 22 associated with each unexposed region 12. Thus, the opaque region 12$a$ has the unexposed indicias 22$a$, 22$b$, 22$e$, and 22$f$ associated therewith. The opaque region 12$b$ has the unexposed indicias 22$c$, 22$d$, 22$g$, and 22$h$ associated therewith. Similarly, the other two opaque regions 12$c$ and 12$d$ have four unexposed indicias 22 positioned in a defined relationship with them.

In the example shown in FIG. 4, the four unexposed indicias 22 associated with each opaque region 12 are located on the left scribe line, in the upper and lower extremes thereof, and in the right scribe line in the upper and lower extreme thereof. Here again, the reference to upper, lower, left and right are with reference to the example shown in FIG. 4.

Surrounding each opaque region 12 is a rectangularly shaped gap 16. Surrounding the gap 16 is a guard ring 18.

Figures 5, 6:
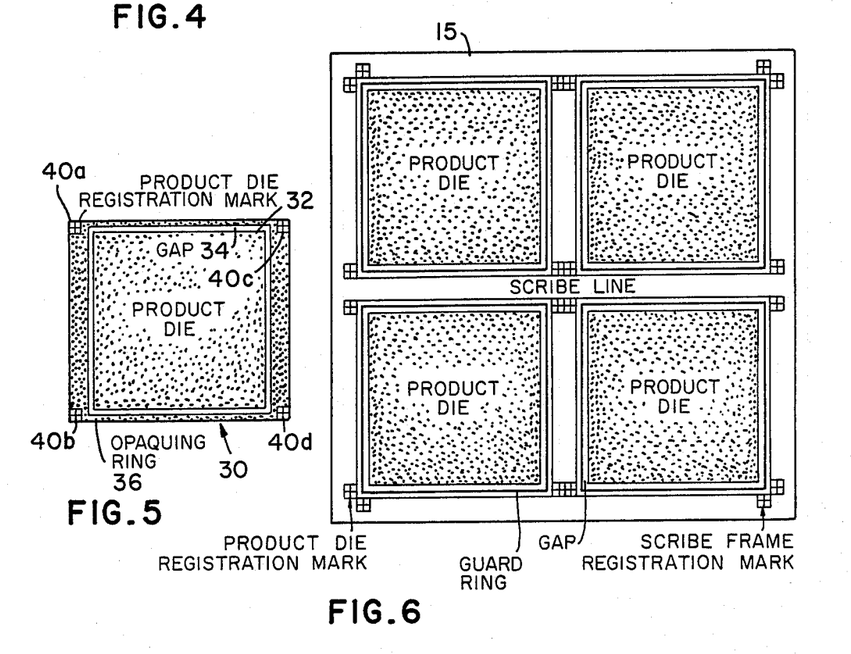
FIG. 5 is a plan schematic view of an example of a product die frame used in the method of the present invention.
FIG. 6 is a schematic plan view of an example of a reticle mask made by the method of the present invention.

After the scribe lines 14 have been formed in the mask 15, a product die frame 30 is then used a plurality of times to form the product die regions 12 ($a$–$d$). Referring to FIG. 5, there is shown a top view of a product die frame 30. The product die frame 30 comprises a single product die pattern that corresponds to the image of the particular layer process desired for the integrated circuit device made from that product die pattern 32. A rectangularly shaped frame gap 34 that is congruent to the gap 16 surrounds the product die pattern 32. A plurality of product die registration marks 40 ($a$–$d$) are positioned in a defined relationship to the product die pattern 32. The product die registration marks 40 ($a$–$d$) are positioned in the same defined relationship to the product die pattern 32 as the unexposed indicias 22 are in relationship to the opaque region 12. An opaque ring 36 fills the rest of the product die frame 30.

In the second pass, of a double pass method to make the reticle mask 15, the product die frame 30 is positioned over the mask 15, exposed in the first pass, with the product die pattern 32 positioned on top of the opaque region 12$a$ and the product die registration marks 40 ($a$–$d$) positioned on top of the unexposed indicias 22 ($a$, $b$, $e$, $f$). The mask is then exposed. The product die frame 30 is then advanced to the next region and positioned over the opaque region 12$b$ and the unexposed indicias 22 associated therewith. The mask is then exposed again. This process continues until all four unexposed regions 12 and their associated unexposed indicias 22 have been exposed to the product die pattern 32 and its associated registration marks 40. The result is the reticle mask 15 shown in FIG. 6.

The opaquing ring 36 in the product die frame 30 prevents the scribe line regions 14 from being exposed during the second pass except where there are openings for the product die registration marks 40 (a-d). Alternatively, if the guard ring 18 is placed in the product die frame 30, the opaquing ring 36 could have been placed in the scribe frame 8 during the first pass and eliminated from the product die frame 30 in the second pass. The first alignment marks 20 (a-d) have been provided in the scribe frame 8 to provide a reference by which to measure the registration of the scribe line pattern of one reticle mask to another, and of the relationship of the scribe lines to the product die patterns 32.

It should also be clear from the forgoing description that depending on the mask making process used, the opaque regions and the exposed regions may be reversed. Thus, the mask that is made by the process disclosed herein is shown in FIG. 6. It comprises scribe lines with exposed alignment marks. Depending the particular process to be used for the reticle mask 15, the reverse image of the foregoing may be made on the reticle mask 15.

Furthermore, the method of the present invention is not limited to the making of a reticle mask with four product regions. In addition, each of the product regions do not have to be congruent with one another. Thus, for example, a different product frame 30 can be used to expose a different product region 12 (a-d).

After the reticle mask 15 is developed, the alignment marks 40 associated with each product die pattern 32 may be compared with the offsets of the marks 20 placed with the scribe line pattern and with any other features on the mask 15. Since the expected locations of all the alignment marks 20 and 32 are known, any difference due to the mask-making process can be quantified.

An apparatus to accomplish the method of the present invention is by the use of a MEBES (TM of Perkin-Elmer Corporation) mask-making machine. The method of the present invention can comprise a software program that is used to prepare patterns for the MEBES mask-making machine. A copy of one embodiment of the software program is shown in Exhibit A. The software program is written in the MAINSAIL (TM of Xidak, Inc.) language. The program computes the placement of the marks in the pattern files and is used in the creation of the patterns to be used on the Mebes mask making machine. The control unit of the Mebes mask making machine is told how to place the product die patterns. There are three procedures set forth in Exhibit A. The first procedure "addNikonMarks" sets aside locations in the scribe frame 8 for the registration marks, so that later procedures do not overwrite them. The second and third procedures ("buildDieOpaquing" and "writeOpaquingToFile") construct the opaquing border shown in FIG. 4, using the placement information calculated by the first procedure.

EXHIBIT A

PROCEDURE 1:

```
boolean procedure addNikonMarks(pointer (scribeSpecification) scribe;
                                long real scaleFactor;
                                long integer liGrid;
                                boolean nikonsVertical,mergeBeforeMEBES;
                                produces pointer (laneInsertCreation)
                                          array (0 to *) nikonBlockers;
                                produces string msg);
begin "add Nikon marks"
    #
    # add maskmaking artifacts (Nikon 2I marks for now) to the scribe frame. i
    # "mergeBeforeMEBES" is not set then make room for 4 per die. otherwise
    # just place 4 in the corners of the scribe frame. the per-die marks block
    # the entire lane because the some of perimeter marks will be placed in th
    # opaquing border, and there is nothing to stop them from exposing over
    # other inserts otherwise. we could either place a dummy in the left/lower
    # lanes or place one insert blocking the whole lane. this is easier.
    #
    long integer liNikonSize,perFrameSize,nikonGap,lowY,highY,leftX,rightX;
    integer i,j,lastHlane,lastVlane,failureIndex;
    string cellName2I;

msg := "";
    #
    # get the cell name expected, change it to an opaquing cell name
    #
    liNikonSize := cvli(do2i.expectedSize(scribe.spaceForNikonMarks,
                                           scaleFactor,
                                           scribe.scribeGrid cellName2I) *
                        100.L);
    lastVlane := scribe.verticalLanes.ub1;
    lastHlane := scribe.horizontalLanes.ub1;
    #
    # at least 1 micron separation; at least 2 grid units between Nikon marks;
    # all in grid units, of course.
    #
    nikonGap := ceiling(((2.L * scribe.scribeGrid) MAX (1.L / scaleFactor)) /
                        scribe.scribeGrid) * liGrid;
    if nikonsVertical then
    begin "maskmaking artifacts in vertical lanes"
        if lastVlane leq scribe.diePlacements.ub2 then
```

```
begin
    msg := "Not enough room for maskmaking artifacts at right side " &
           "of scribe frame.";
    return(false);
end;
if not mergeBeforeMEBES then
begin "add per-die marks"
    new(nikonBlockers,0,lastVlane);
    for i := 1 upto lastVlane do
    begin "in vertical lanes next to each die"
        #
        # build a separate Nikon mark blocker for each vertical lane.
        # block the entire vertical lane. tell BLDSCB that this is an
        # opaquing structure.
        #
        nikonBlockers[i] :=
            newInsertCreation(
                    nikonGap,
                    scribe.verticalLanes[i].laneFillStart,0L,
                    scribe.verticalLanes[i].laneFillEnd,liNikonSize,
                    "o_" & cellName2I,
                    "Vertical lane maskmaking artifact blockage " &
                    "cell. Should never appear outside temporary " &
                    "data structures.");
        if nikonBlockers[i].burx - nikonBlockers[i].bllx <
            (liNikonSize + nikonGap) *
            (if i = 1 or i = lastVlane then 1L else 2L) then
        begin
            msg := "Not enough room for maskmaking artifacts in " &
                   "vertical lane " & cvs(i);
            return(false);
        end;
        for j := 1 upto scribe.diePlacements.ub1 do
        begin "up each lane"
            #
            # put the Nikon marks right next to the lane blockers (if
            # any; they may be in the other set of lanes, although this
            # is unwise). Nikon marks are "acrossLane" because they are at
            # least twice as wide (across the lane) as they are long. this
            # is because each contains two, side by side.
            #
            lowY := scribe.horizontalLanes[j].laneFillEnd + nikonGap;
            highY := (if j < lastHlane
                      then scribe.horizontalLanes[j + 1].laneFillStart
                      else scribe.verticalLanes[i].end2) -
                     nikonGap - liNikonSize;
            if not forceVertical(
                        scribe.verticalLanes[i],nikonBlockers[i],
                        lowY,0L,false,false,false,true,false,
                        failureIndex) or
                not forceVertical(
                        scribe.verticalLanes[i],nikonBlockers[i],
                        highY,0L,false,false,false,true,false,
                        failureIndex) then
                errMsg("Something got in the way of a maskmaking " &
                       "artifact:",cvs(failureIndex),fatal);
        end "up each lane";
    end "in vertical lanes next to each die";
end "add per-die marks"

# just one blocker if per-frame marks only. don't let DO2I round down
# the size again.

    else begin "per-frame only"
        new(nikonBlockers,0,0);
        liNikonSize := cvli(scribe.spaceForNikonMarks * 100.L);
    end "per-frame only";
    #
    # we always put Nikon marks in the corners of the scribe frame.
    #
```

```
       if not makePerFrameMark(liNikonSize,nikonGap,mergeBeforeMEBES,
                       scaleFactor,scribe.scribeGrid,
                       scribe.verticalLanes,nikonBlockers[0],
                       msg,perFrameSize) then
           return(false);
       lowY := scribe.horizontalLanes[1].laneFillEnd + nikonGap;
       if scribe.horizontalLanes.ub1 > scribe.diePlacements.ub1 then
           highY := scribe.horizontalLanes[lastHlane].laneFillStart -
                   nikonGap - perFrameSize
       else
           highY := scribe.verticalLanes[1].end2 - nikonGap - perFrameSize;
       if not mergeBeforeMEBES then
       begin "extra room"
           lowY .+ (liNikonSize + 2L * nikonGap);
           highY .- (liNikonSize + 2L * nikonGap);
       end "extra room";
       if not forceVertical(scribe.verticalLanes[1],   # not acrossLane
                       nikonBlockers[0],lowY,0L,
                       false,false,false,false,false,failureIndex) or
          not forceVertical(scribe.verticalLanes[1],
                       nikonBlockers[0],highY,0L,
                       false,false,false,false,false,failureIndex) or
          not forceVertical(scribe.verticalLanes[lastVlane],
                       nikonBlockers[0],lowY,0L,
                       false,false,false,false,false,failureIndex) or
          not forceVertical(scribe.verticalLanes[lastVlane],
                       nikonBlockers[0],highY,0L,
                       false,false,false,false,false,failureIndex) then
           errMsg("Unable to place per-frame maskmaking artifacts:",
                   cvs(failureIndex),fatal);
   end "maskmaking artifacts in vertical lanes"
   else begin "maskmaking artifacts in horizontal lanes"
       if lastHlane leq scribe.diePlacements.ub1 then
       begin
           msg := "Not enough room for maskmaking artifacts at top " &
                   "of scribe frame.";
           return(false);
       end;
       if not mergeBeforeMEBES then
       begin "add per-die marks"
           new(nikonBlockers,0,lastHlane);
           for i := 1 upto lastHlane do
           begin "in horizontal lanes next to each die"
               #
               # build a separate Nikon mark blocker for each horizontal lane.
               # block the entire horizontal lane.
               #
               nikonBlockers[i] :=
                       newInsertCreation(
                           nikonGap,
                           0L,scribe.horizontalLanes[i].laneFillStart,
                           liNikonSize,scribe.horizontalLanes[i].laneFillEnd,
                           "o_" & cellName2I,
                           "Horizontal lane maskmaking artifact blockage " &
                           "cell. Should never appear outside temporary " &
                           "data structures.");
               if nikonBlockers[i].bury - nikonBlockers[i].blly <
                   (liNikonSize + nikonGap) *
                   (if i = 1 or i = lastHlane then 1L else 2L) then
               begin
                   msg := "Not enough room for maskmaking artifacts in " &
                           "horizontal lane " & cvs(i);
                   return(false);
               end;
               for j := 1 upto scribe.diePlacements.ub2 do
               begin "along each lane"
                   #
                   # put the Nikon marks right next to the lane blockers (if
                   # any; they may be in the other set of lanes, although this
                   # is unwise).
                   #
```

```
            leftX := scribe.verticalLanes[j].laneFillEnd + nikonGap;
            rightX := (if j < lastVlane
                      then scribe.verticalLanes[j + 1].laneFillStart
                      else scribe.horizontalLanes[i].end2) -
                      nikonGap - liNikonSize;
            #
            # "false,false,false,true,false" means:
            # center in lane; not justChecking; no rotation; acrossLane;
            # and do not assign instanceName.
            #
            if not forceHorizontal(
                        scribe.horizontalLanes[i],nikonBlockers[i],
                        leftX,0L,false,false,false,true,false,
                        failureIndex) or
               not forceHorizontal(
                        scribe.horizontalLanes[i],nikonBlockers[i],
                        rightX,0L,false,false,false,true,false,
                        failureIndex) then
                errMsg("Something got in the way of a maskmaking " &
                        "artifact:",cvs(failureIndex),fatal);
        end "along each lane";
    end "in horizontal lanes next to each die";
end "add per-die marks"

# just one blocker if per-frame marks only. don't let DO2I round down
# the size again.

else begin "per-frame only"
    new(nikonBlockers,0,0);
    liNikonSize := cvli(scribe.spaceForNikonMarks * 100.L);
end "per-frame only";

# we always put Nikon marks in the corners of the scribe frame.

if not makePerFrameMark(liNikonSize,nikonGap,mergeBeforeMEBES,
                        scaleFactor,scribe.scribeGrid,
                        scribe.horizontalLanes,nikonBlockers[0],
                        msg,perFrameSize) then
    return(false);
leftX := scribe.verticalLanes[1].laneFillEnd + nikonGap;
if scribe.verticalLanes.ub1 > scribe.diePlacements.ub2 then
    rightX := scribe.verticalLanes[lastVlane].laneFillStart -
              nikonGap - perFrameSize
else
    rightX := scribe.horizontalLanes[1].end2 - nikonGap - perFrameSize;
if not mergeBeforeMEBES then
begin "extra room"
    leftX .+ (liNikonSize + 2L * nikonGap);
    rightX .- (liNikonSize + 2L * nikonGap);
end "extra room";
if not forceHorizontal(scribe.horizontalLanes[1],
``` owner='rly:sf:lls'

```
RRRRRR   L       Y    Y              SSSSS   FFFFFFF          L
R    R   L        Y  Y               S    S  F                L
R    R   L         Y Y      **       S       F         **     L
R    R   L          Y       **       S       F         **     L
RRRRRR   L          Y                SSSSS   FFFFF            L
R  R     L          Y                    S   F                L
R   R    L          Y       **           S   F         **     L
R    R   L          Y       **           S   F         **     L
R     R  L          Y                S   S   F                L
R      R LLLLLLL    Y                  SSSSS F                LLLLLLL
```

Despooler of 3Share - version 1.1 file spooled: 27-apr-88,  16:17:50
file printed: 27-apr-88,  16:18:22
copies=1,  priority=50,  form type=1

```
                              nikonBlockers[0],leftX,0L,false,
                              false,false,false,false,failureIndex) or
            not forceHorizontal(scribe.horizontalLanes[1],
                              nikonBlockers[0],rightX,0L,false,
                              false,false,false,false,failureIndex) or
            not forceHorizontal(scribe.horizontalLanes[lastHlane],
                              nikonBlockers[0],leftX,0L,false,
                              false,false,false,false,failureIndex) or
            not forceHorizontal(scribe.horizontalLanes[lastHlane],
                              nikonBlockers[0],rightX,0L,false,
                              false,false,false,false,failureIndex) then
           errMsg("Unable to place per-frame maskmaking artifacts:",
                  cvs(failureIndex));
     end "maskmaking artifacts in horizontal lanes";

return(true);

end "add Nikon marks";

PROCEDURE 2:

#'pointers to the 4 per-die marks for each die in the scribe frame.

class dieOpaquing (
        pointer (laneInsertPlacement) mark1,mark2,mark3,mark4;
        string dieName;
        long integer l11S,l111,l12S,l121,l13S,l131,l14S,l141;
);

boolean procedure buildDieOpaquing(pointer (scribeSpecification) scribe;
                                   boolean nikonsVertical;
                                   produces pointer (dieOpaquing) array
                                              (1 to *,1 to *) allOpaquing);
begin "construct opaquing structures"
    #
    # search the scribe structure for opaquing Nikon marks, which tell us that
    # we must build an opaquing structure should the pattern files NOT be
    # merged the mask is made (not mergeBeforeMEBES).
    #
    # WARNING: if a given die has more than one placement in a scribe with mor
    # than one die type, there is a risk that several opaquing borders will be
    # necessary for EACH DIE. with the proper pattern file merging software,
    # this might not require multiple conversions.
    #
    integer rows,cols,i,j,k;
    long integer coord1,coordS,leftX,l1y;
    pointer (insertLane) array (1 to *) useLanes,otherLanes;
    pointer (insertLane) thisLane,otherLane;
    pointer (dieSpecification) thisDie;
    pointer (laneInsertPlacement) thisInsert;
    pointer (dieOpaquing) opaquing;

rows := scribe.diePlacements.ub1;
    cols := scribe.diePlacements.ub2;
    new(allOpaquing,1,rows,1,cols);
    if nikonsVertical then
    begin
       useLanes := scribe.verticalLanes;
       otherLanes := scribe.horizontalLanes;
       ASSERT(useLanes.ub1 > cols);
    end
    else begin
       useLanes := scribe.horizontalLanes;
       otherLanes := scribe.verticalLanes;
       ASSERT(useLanes.ub1 > rows);
    end;

for i := 1 upto rows do
    begin "each row"
        for j := 1 upto cols do
        begin "each column"
```

```

# find the 4 opaquing marks for this die, left/bottom first.

thisDie := scribe.diePlacements[i,j];
opaquing := allOpaquing[i,j] := new(dieOpaquing);
opaquing.dieName := thisDie.dieName;
thisLane := useLanes[if nikonsVertical then j else i];
otherLane := otherLanes[if nikonsVertical then i else j];
if not thisLane.inserts then
begin
    write(logFile,"There are no maskmaking artifacts in lane ",
                  thisLane.laneNumber,".",eol);
    return(false);
end;
for k := 1 upto thisLane.inserts.ub1 do
begin "search lane"
    thisInsert := thisLane.inserts[k];
    #
    # opaquing structures have special cell names.
    #
    if not equ("o_",thisInsert.cellName[1 to 2],upperCase) or
       not equ("do2i",thisInsert.creationSpec.mModuleName,upperCase)
    then
        continue "search lane";
    lly := thisInsert.tblly MIN thisInsert.tally;
    leftX := thisInsert.tbllx MIN thisInsert.tallx;
    if nikonsVertical then
    begin
        coordl := lly;
        coordS := leftX;
    end
    else begin
        coordl := leftX;
        coordS := lly;
    end;
    if coordS geq thisLane.centerCoord and
       coordl geq otherLane.laneFillEnd then
    begin "for this insert"
        if opaquing.mark1 then
        begin
            opaquing.mark2 := thisInsert;
            opaquing.ll2S := coordS;
            opaquing.ll2l := coordl;
        end
        else begin
            opaquing.mark1 := thisInsert;
            opaquing.ll1S := coordS;
            opaquing.ll1l := coordl;
        end;
    end "for this insert";
end "search lane" until opaquing.mark2;
if not opaquing.mark1 or not opaquing.mark2 then
begin
    write(logFile,"Some maskmaking artifacts are missing in lane ",
                  thisLane.laneNumber,".",eol);
    return(false);
end;

# get the marks on the right/top.

thisLane := useLanes[thisLane.laneNumber + 1];
if not thisLane.inserts then
begin
    write(logFile,"There are no maskmaking artifacts in lane ",
                  thisLane.laneNumber,".",eol);
    return(false);
end;
for k := 1 upto thisLane.inserts.ub1 do
begin "search lane"
    thisInsert := thisLane.inserts[k];
    if not equ("o_",thisInsert.cellName[1 to 2],upperCase) or
       not equ("do2i",thisInsert.creationSpec.mModuleName,upperCase)
```

```
            then
                continue "search lane";
            lly := thisInsert.tblly MIN thisInsert.tally;
            leftX := thisInsert.tbllx MIN thisInsert.tallx;
            if nikonsVertical then
            begin
                coordl := lly;
                coordS := leftX;
            end
            else begin
                coordl := leftX;
                coordS := lly;
            end;
            if coordS < thisLane.centerCoord and
               coordl geq otherLane.laneFillEnd then
            begin "for this insert"
                if opaquing.mark3 then
                begin
                    opaquing.mark4 := thisInsert;
                    opaquing.ll4S := coordS;
                    opaquing.ll4l := coordl;
                end
                else begin
                    opaquing.mark3 := thisInsert;
                    opaquing.ll3S := coordS;
                    opaquing.ll3l := coordl;
                end;
            end "for this insert";
        end "search lane" until opaquing.mark4;
        if not opaquing.mark3 or not opaquing.mark4 then
        begin
            write(logFile,"Some maskmaking artifacts are missing in lane ",
                          thisLane.laneNumber,".",eol);
            return(false);
        end;
        #
        #
        # ensure the members of each pair are in the same lane position.
        #
        #
        if opaquing.llll neq opaquing.ll3l or
           opaquing.ll2l neq opaquing.ll4l then
        begin
            write(logFile,"Some of the maskmaking artifacts for the die " &
                          "in row ",i,", column ",j," are misplaced.",eol);
            return(false);
        end;
    end "each column";
end "each row";

return(true);

end "construct opaquing structures";

PROCEDURE 3:
procedure writeOpaquingToFile(pointer (CIFwriteInt) out;
                              pointer (textFile) BBXfile;
                              pointer (toolingSpecification) spec;
                              pointer (fabDataBaseMgr) fabDB;
                              pointer (scribeSpecification) scribe;
                              boolean nikonsVertical;
                              pointer (dieSpecification) thisDie;
                              pointer (dieOpaquing) opaquing);
begin "write opaquing CIF"
    #
    #
    # write each opaquing structure to a different CIF file.
    #
    #
    pointer (laneInsertCreation) realNikon;
    long integer nikonCellNumber,topLevel,gap;
    long integer nbllx,nblly,nburx,nbury,nallx,nally,naurx,naury;
    long integer ux,uy,tx1,ty1,tx2,ty2,tx3,ty3,tx4,ty4;
    long integer x1,x2,x3,x4,x5,x6,y1,y2,y3,y4,y5,y6;
    string msg,cellName;
    integer i,status;
```

```

# find the distance between the end of the guard ring and user data. don't
# fill it with an opaquing border; it confuses product engineers because
# they think it's going to short out their pads.

# overlap the guard ring a bit to keep it from being clipped. 4 grid units
# should be enough. don't overlap the die.

gap := 0L;
for i := 1 upto scribe.verticalWOs.ubl do
    gap .MAX (scribe.verticalWOs[i].absoluteWidth +
              scribe.verticalWOs[i].absoluteOffset);
gap := (scribe.verticalLanes[1].userData - gap -
        cvli(scribe.scribeGrid * 400.L)) MAX 0L;

ASSERT(thisDie.dieName = opaquing.dieName);
realNikon := new(laneInsertCreation);
copy(opaquing.mark1.creationSpec,realNikon);

if not do2i.drawInsert(spec,fabDB,scribe.invertedMaskLevels,
                       opaquing.mark1.creationSpec.cellName[3 to inf],
                       out,msg,status,nbllx,nblly,nburx,nbury,
                       nallx,nally,naurx,naury,nikonCellNumber,cellName,
                       opaquing.mark1.creationSpec.maskNumber,
                       opaquing.mark1.creationSpec.insertIndex) then
    errMsg("Unable to draw maskmaking artifact for opaquing:",msg,fatal);
topLevel := out.startDef("opaquing");

# the die is in the center of an array of 4 Nikon marks. place the
# maskmaking artifacts in the coordinate space of the die so they drop
# right in.

ux := (nburx MAX naurx) - (nbllx MIN nallx);
uy := (nbury MAX naury) - (nblly MIN nally);
tx1 := opaquing.mark1.tx - thisDie.tx;
ty1 := opaquing.mark1.ty - thisDie.ty;
tx2 := opaquing.mark2.tx - thisDie.tx;
ty2 := opaquing.mark2.ty - thisDie.ty;
tx3 := opaquing.mark3.tx - thisDie.tx;
ty3 := opaquing.mark3.ty - thisDie.ty;
tx4 := opaquing.mark4.tx - thisDie.tx;
ty4 := opaquing.mark4.ty - thisDie.ty;

if nikonsVertical then
begin "vertical"
    #
    # boxes to fill: between left marks, between right marks, from left
    # marks to left side of die, from right side of die to right marks,
    # below die, above die
    #
    x1 := opaquing.l11S - thisDie.tx;    # left side of left marks
    x2 := x1 + ux;                        # right side of left marks
    x3 := thisDie.llx - gap;              # end of opaquing at left side of di
    x4 := thisDie.urx + gap;              # start of opaquing
    x5 := opaquing.l13S - thisDie.tx;    # left side of right marks
    x6 := x5 + ux;                        # right side of right marks
    y1 := opaquing.l111 - thisDie.ty;    # bottom of bottom marks
    y2 := y1 + uy;                        # top of bottom marks
    y3 := thisDie.lly - gap;              # end of opaquing at bottom
    y4 := thisDie.ury + gap;              # start of opaquing at top
    y5 := opaquing.l121 - thisDie.ty;    # bottom of top marks
    y6 := y5 + uy;                        # top of top marks
    opaquingBox(out,spec,scribe,fabDB,x1,y2,x2,y5);
    opaquingBox(out,spec,scribe,fabDB,x5,y2,x6,y5);
    opaquingBox(out,spec,scribe,fabDB,x2,y1,x3,y6);
    opaquingBox(out,spec,scribe,fabDB,x4,y1,x5,y6);
    opaquingBox(out,spec,scribe,fabDB,x3,y1,x4,y3);
    opaquingBox(out,spec,scribe,fabDB,x3,y4,x4,y6);
end "vertical"
else begin "horizontal"
```

```

# boxes to fill: between bottom marks, between top marks, from bottom
# marks to bottom of die, from top of die to top marks, left of die,
# right of die

    x1 := opaquing.l1l1 - thisDie.tx;
    x2 := x1 + ux;
    x3 := thisDie.llx - gap;
    x4 := thisDie.urx + gap;
    x5 := opaquing.l121 - thisDie.tx;
    x6 := x5 + ux;
    y1 := opaquing.l11S - thisDie.ty;
    y2 := y1 + uy;
    y3 := thisDie.lly - gap;
    y4 := thisDie.ury + gap;
    y5 := opaquing.l13S - thisDie.ty;
    y6 := y5 + uy;
    opaquingBox(out,spec,scribe,fabDB,x2,y1,x5,y2);
    opaquingBox(out,spec,scribe,fabDB,x2,y5,x5,y6);
    opaquingBox(out,spec,scribe,fabDB,x1,y2,x6,y3);
    opaquingBox(out,spec,scribe,fabDB,x1,y4,x6,y5);
    opaquingBox(out,spec,scribe,fabDB,x1,y3,x3,y4);
    opaquingBox(out,spec,scribe,fabDB,x4,y3,x6,y4);
end "horizontal";

# now place the marks. write an abutment box and a conversion BBX too.

out.call(nikonCellNumber,transIdentity,
        cvlr(tx1) / 100.L,cvlr(ty1) / 100.L,"mark1");
out.call(nikonCellNumber,transIdentity,
        cvlr(tx2) / 100.L,cvlr(ty2) / 100.L,"mark2");
out.call(nikonCellNumber,transIdentity,
        cvlr(tx3) / 100.L,cvlr(ty3) / 100.L,"mark3");
out.call(nikonCellNumber,transIdentity,
        cvlr(tx4) / 100.L,cvlr(ty4) / 100.L,"mark4");
out.writeAbutBox(cvlr(x1) / 100.L,cvlr(y1) / 100.L,
                 cvlr(x6) / 100.L,cvlr(y6) / 100.L);
write(BBXfile,x1," ",y1," ",x6," ",y6,eol);
out.finishDef;
out.call(topLevel,transIdentity,0.L,0.L);

end "write opaquing CIF";
```

What is claimed is:

1. A method of making a reticle mask having a plurality of spaced apart, product regions, each product region for use in the fabrication of integrated circuit devices and a plurality of border regions surrounding each product region, with a plurality of alignment marks in said border regions; said reticle mask having regions of one type of exposure and regions of another type of exposure, opposite to said one type of exposure, said method comprising the steps of:

(a) exposing an unexposed mask to form a plurality of spaced apart product regions, of one type of exposure, and to form a plurality of first regions, said first regions congruent with and corresponding to said border regions, said first regions having areas of said another type of exposure, and a plurality of indicias of said one type of exposure, each of said indicias being positioned in a defined relationship with each of said product regions; then (b) exposing said mask to a product frame, said product frame having a product region, a plurality of first alignment marks outside of said product region positioned in said defined relationship with said product region, and a ring of said one type of exposure surrounding said product region and covering the rest of said product frame; said exposing step comprising:

(i) positioning said product region of said product frame over one of said product regions of said mask and positioning said first alignment marks over said plurality of indicias of said mask;

(ii) exposing said mask with said product frame;

(iii) repeating the steps of (b)(1-2) by positioning another product frame over another product region, until all of said product regions and indicias have been exposed.

2. The method of claim 1 wherein said product region is substantially rectangularly shaped.

3. The method of claim 1 wherein each of said first alignment marks are substantially rectangularly shaped.

4. The method of claim 1 wherein a plurality of second alignment marks are formed in said first regions during the process of exposing an unexposed mask.

5. The method of claim 1 wherein said plurality of second alignment marks are substantially rectangularly shaped.

6. The method of claim 1 wherein said first alignment marks are positioned symmetrically about each of said product regions.

7. The method of claim 1 wherein said one type of exposure is opaque and said another type of exposure is transparent.

8. The method of claim 1 wherein said product regions are congruent to one another, and said positioning step of (b)(iii) comprises moving said product frame over another product region.

9. A method of making a reticle mask having a plurality of spaced apart, product regions, each product region for use in the fabrication of integrated circuit devices and a plurality of border regions surrounding each product region, with a plurality of alignment marks in said border regions; said reticle mask having regions of one type of exposure and regions of another type of exposure, opposite to said one type of exposure, said method comprising the steps of:
  (a) exposing an unexposed mask to form a plurality of spaced apart product regions, of one type of exposure, and to form a plurality of first regions, said first regions congruent with and corresponding to said border regions, said first regions having areas of said another type of exposure, a plurality of indicias of said one type of exposure, and a ring of said one type of exposure surrounding each of said product regions, each of said indicias being positioned in a defined relationship with each of said product regions; then
  (b) exposing said mask to a product frame, said product frame having a product region, and a plurality of first alignment marks outside of said product region positioned in said defined relationship with said product region; said exposing step comprising:
    (i) positioning said product region of said product frame over one of said product regions of said mask and positioning said first alignment marks over said plurality of indicias of said mask;
    (ii) exposing said mask with said product frame;
    (iii) repeating the steps of (b)(1-2) by positioning another product frame to another product region, until all of said product regions and indicias have been exposed.

10. The method of claim 9 wherein said product region is substantially rectangularly shaped.

11. The method of claim 9 wherein each of said first alignment marks are substantially rectangularly shaped.

12. The method of claim 9 wherein a plurality of second alignment marks are formed in said first regions during the process of exposing an unexposed mask.

13. The method of claim 11 wherein said plurality of second alignment marks are substantially rectangularly shaped.

14. The method of claim 9 wherein said first alignment marks are positioned symmetrically about each of said product regions.

15. The method of claim 9 wherein said one type of exposure is opaque and said another type of exposure is transparent.

16. The method of claim 9 wherein said product regions are congruent to one another, and said positioning step of (b)(iii) comprises moving said product frame over another product region.

* * * * *